United States Patent
Young et al.

(10) Patent No.: US 10,888,021 B2
(45) Date of Patent: *Jan. 5, 2021

(54) APPARATUS FOR DYNAMIC POSITIONING OF A FAN TO REDUCE NOISE

(71) Applicant: Lenovo Enterprise Solutions (Singapore) Pte. Ltd., Singapore (SG)

(72) Inventors: Bryan L. Young, Tualatin, OR (US); Gary D. Cudak, Wake Forest, NC (US); Amy L. Rose, Chapel Hill, NC (US); Jennifer J. Lee-Baron, Morrisville, NC (US); John S. Crowe, Durham, NC (US); Nathan J. Peterson, Durham, NC (US)

(73) Assignee: Lenovo Enterprise Solutions (Singapore) Pte. Ltd., Singapore (SG)

(*) Notice: Subject to any disclaimer, the term of this patent is extended or adjusted under 35 U.S.C. 154(b) by 304 days.

This patent is subject to a terminal disclaimer.

(21) Appl. No.: 16/018,294

(22) Filed: Jun. 26, 2018

(65) Prior Publication Data

US 2018/0310434 A1 Oct. 25, 2018

Related U.S. Application Data

(63) Continuation of application No. 15/292,337, filed on Oct. 13, 2016, now Pat. No. 10,043,507.

(51) Int. Cl.
*G10K 11/175* (2006.01)
*F24F 13/24* (2006.01)
(Continued)

(52) U.S. Cl.
CPC ......... *H05K 7/20209* (2013.01); *F04D 15/00* (2013.01); *F04D 19/002* (2013.01);
(Continued)

(58) Field of Classification Search
CPC .. G10K 11/004; G10K 11/175; G10K 11/161; G10K 2210/11; F04D 15/00;
(Continued)

(56) References Cited

U.S. PATENT DOCUMENTS 4,872,397 A * 10/1989 Demeter .................. F24F 1/00
454/229
5,221,185 A * 6/1993 Pla .......................... B64C 11/50
244/1 N
(Continued)

*Primary Examiner* — Edgardo San Martin
(74) *Attorney, Agent, or Firm* — Jeffrey Streets

(57) ABSTRACT

An apparatus includes a computer enclosure with a first fan, a second fan, a fan controller, and an input for receiving a signal from a microphone indicating an amount of noise at a target location. The apparatus further includes a first actuator coupled to the first fan for adjusting an axial position of the first fan, wherein the controller controls the operation of the first actuator to position the first fan to reduce the noise indicated by the signal from the microphone with the first and second fans in operation. The microphone senses sound pressure and the controller automatically adjusts a position of one or more fans using an actuator to change the distance from the fan to the microphone, which may be co-located with a user, to provide destructive interference at the location of the microphone.

10 Claims, 7 Drawing Sheets

(51) Int. Cl.
    *H05K 7/20*         (2006.01)
    *F04D 19/00*       (2006.01)
    *G10K 11/16*       (2006.01)
    *F04D 27/00*       (2006.01)
    *F04D 25/16*       (2006.01)
    *F04D 29/66*       (2006.01)
    *F04D 15/00*       (2006.01)
    *G10K 11/00*       (2006.01)
    *G06F 1/16*         (2006.01)
    *H04R 1/22*         (2006.01)
    *H04R 3/00*         (2006.01)
    *G10K 11/178*     (2006.01)

(52) U.S. Cl.
    CPC ......... *F04D 25/166* (2013.01); *F04D 27/001* (2013.01); *F04D 27/004* (2013.01); *F04D 29/663* (2013.01); *G06F 1/1633* (2013.01); *G10K 11/004* (2013.01); *G10K 11/161* (2013.01); *G10K 11/175* (2013.01); *H04R 1/22* (2013.01); *H04R 3/00* (2013.01); *F05D 2270/333* (2013.01); *G10K 11/178* (2013.01); *G10K 2210/11* (2013.01)

(58) Field of Classification Search
    CPC ...... F04D 19/002; F04D 25/08; F04D 29/663; F04D 29/665; H04R 1/20; H04R 1/22; F24F 7/06; F24F 11/79; F24F 11/30; F24F 13/24; F24F 2013/247; H05K 7/20209; H05K 7/20; H05K 7/20709; H05K 7/20536; H05K 7/20009; F01N 1/06; F02M 35/1244
    See application file for complete search history.

(56) References Cited

U.S. PATENT DOCUMENTS

| | | | | |
|---|---|---|---|---|
| 5,388,956 | A * | 2/1995 | Pla | F04D 25/166 |
| | | | | 415/1 |
| 5,692,054 | A * | 11/1997 | Parrella | F04D 29/665 |
| | | | | 381/71.3 |
| 5,788,568 | A * | 8/1998 | Ito | F04D 25/166 |
| | | | | 415/119 |
| 6,366,832 | B2 * | 4/2002 | Lomonaco | F24F 11/0001 |
| | | | | 700/276 |
| 8,218,781 | B1 * | 7/2012 | Swanke | G10K 11/178 |
| | | | | 381/71.3 |
| 8,408,170 | B2 * | 4/2013 | Kardos | F01P 7/026 |
| | | | | 123/41.12 |
| 8,855,329 | B2 * | 10/2014 | Slapak | F24F 13/24 |
| | | | | 181/201 |
| 8,963,466 | B2 * | 2/2015 | Hopkins | H02P 5/52 |
| | | | | 318/114 |
| 9,765,684 | B2 * | 9/2017 | Schroeder | F04D 29/052 |
| 10,043,507 | B2 * | 8/2018 | Young | G10K 11/004 |
| 10,309,421 | B2 * | 6/2019 | Kelaher | F04D 29/665 |
| 10,388,327 | B2 * | 8/2019 | Eguchi | G11B 33/128 |
| 2005/0217540 | A1 * | 10/2005 | Novak | A47B 83/001 |
| | | | | 108/50.01 |
| 2007/0098547 | A1 * | 5/2007 | Vinson | F04D 25/0613 |
| | | | | 415/173.1 |
| 2012/0076649 | A1 * | 3/2012 | Ye | F04D 29/646 |
| | | | | 415/213.1 |
| 2017/0234330 | A1 * | 8/2017 | Kelaher | F04D 29/522 |
| | | | | 415/1 |
| 2017/0241439 | A1 * | 8/2017 | Camacho | F04D 25/084 |

* cited by examiner

APPARATUS FOR DYNAMIC POSITIONING OF A FAN TO REDUCE NOISE

CROSS-REFERENCE TO RELATED APPLICATIONS

This application is a continuation of U.S. patent application Ser. No. 15/292,337 filed on Oct. 13, 2016, which application is incorporated by reference herein.

BACKGROUND

The present disclosure relates to an apparatus for reducing noise produced by multiple fans.

BACKGROUND OF THE RELATED ART

Computers perform many important and valuable tasks, but produce heat that must be removed from the computer to avoid damage to the components. The simplest and most common means for removing this heat is forced air circulation through a computer enclosure. For this purpose, fans may be installed in each computer or each multi-node chassis in order to assure that an adequate volume of air flows through each device. The speed of a fan, such as the rotational speed of an axial fan, will generally increase to prevent a critical component, such as a central processing unit, from reaching a high temperature threshold. As the workload on the computer increases, the amount of heat generated by computer will also increase, therefore requiring an increase in air flow through the computer. The actual speed of a fan is further dependent upon the ambient temperature of the air that is forced through the computer. Due to the dynamic nature of a computer workload and possible ambient air temperature variations, a computer fan may operate over a range of speeds during a period of operation.

When numerous computers are located in the same place, such as an office or datacenter, the level of noise created by the fans can be a problem. While the noise may be a mere annoyance in some situations, the level of noise can become so high as to damage a person's hearing. While fans must be allowed to perform their basic function of cooling the computer components, there have been efforts directed at reducing the noise produced by the fans. For example, fans may be operated at the lowest speed (measured in rotations per minute, RPMs) that will adequately cool the components and may change fan speeds slowly so that any increase in noise is less noticeable. Further options for reducing noise include distributing workload evenly across all available computers or even throttling workload to prevent any increase in a fan speed.

BRIEF SUMMARY

One embodiment provides an apparatus comprising a computer enclosure including a first fan, a second fan, a fan controller, and an input for receiving a signal from a microphone indicating an amount of noise at a target location. The apparatus further comprises a first actuator coupled to the first fan for adjusting an axial position of the first fan, wherein the controller controls the operation of the first actuator to position the first fan to reduce the noise indicated by the signal from the microphone with the first and second fans in operation.

DETAILED DESCRIPTION

Figure 1:
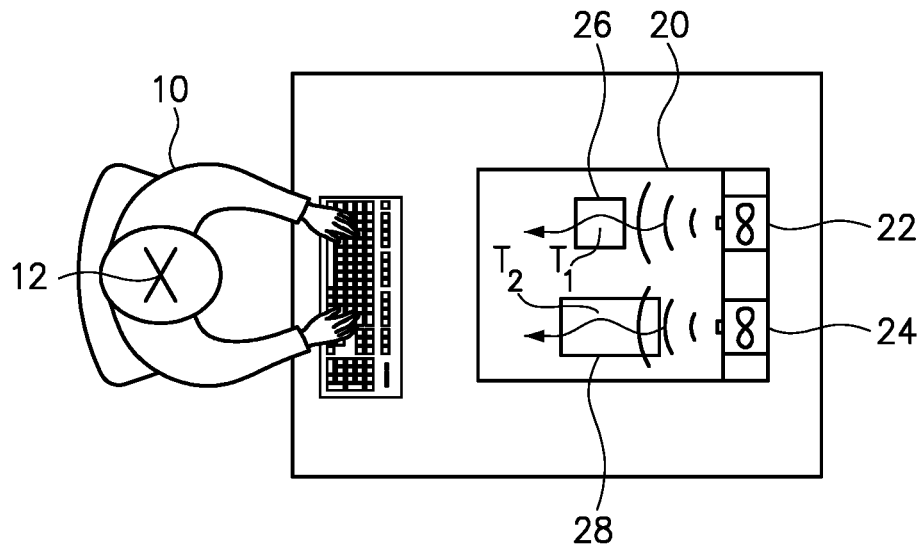
FIG. 1 is a schematic top view of a person working at a compute node.

One embodiment provides an apparatus comprising a computer enclosure including a first fan, a second fan, a fan controller, and an input for receiving a signal from a microphone indicating an amount of noise at a target location. The apparatus further comprises a first actuator coupled to the first fan for adjusting an axial position of the first fan, wherein the controller controls the operation of the first actuator to position the first fan to reduce the noise indicated by the signal from the microphone with the first and second fans in operation.

Another embodiment provides a method comprising sensing sound pressure at a specified location, and a controller automatically adjusting a position of one or more fans among a plurality of fans to reduce the sound pressure sensed at the specified location.

Sound pressure may be measured by a microphone. A microphone is a transducer that converts sound into an electrical signal. Accordingly, the microphone may generate an electrical signal indicating the instantaneous sound pressure at the location of the microphone. The specified location of the microphone may be any desired location where the sound of multiple fans may be an issue. For example, a microphone may be positioned at any fixed point in a room or area containing the fans, or a microphone may be secured to a person working in, and perhaps moving about within, the room or area. For the purpose of reducing the amount of noise experienced by a person, the microphone is preferably positioned where the person may sit or otherwise spend the most time. Optionally, a signal from a headset microphone may be provided to the controller as a basis for adjusting the position of one or more fans. Alternatively, the microphone may be dedicated solely to sensing sound pressure of the fans. The controller may, for example, be local to the one or more computers or may be a management node in communication with the one or more compute nodes over a network.

Embodiments may use an apparatus for positioning the one or more fans over a range of positions. Such apparatus may take many forms, but generally includes an actuator that is automatically adjustable to position the fan in response to a control signal from the controller. For example, the actuator may be an electric motor controlling a rotary gear that engages linear gear teeth secured to the fan assembly or duct. Such an actuator may be referred to as a "rack and pinion" type actuator. In one implementation, an outlet side of the fan is coupled to an extendable duct, which may include a plurality of nested tubes. An inlet end of the extendable duct receives airflow from the fan and an outlet end of the extendable duct exhausts the airflow out of the chassis or computer enclosure. Besides the benefits of positioning the fan, the use of a duct may also focus and tune the sound coming from the fan.

In another embodiment, the controller may automatically adjust a speed of one or more fans among the plurality of fans to reduce the sound pressure sensed at the specified location. In the absence of substantial details and measurements of the compute node layout, the automatic adjustments may include a trial and error approach to reducing sound pressure. Like adjusting the position of a fan, adjusting the speed of a fan may have the effect of moving the location of destructive interference. A sufficient adjustment of fan position and/or fan speed may be implemented in order to cause destructive interference at a specified location. In one option, the position of the one or more fans is adjusted to the full extent of the range of positions before adjusting the speed of the one or more fans. In this manner, fan position is used to achieve as much noise reduction as possible. In some situations, positioning one or more fans may provide sufficient noise reduction, such that no fan speed adjustment is necessary. This may be desirable, since the fan speed may be controlled with a focus on component temperature control and perhaps fan power efficiency rather than noise.

The fan position may be adjusted at any time, including continuous adjustment, periodic adjustment, or adjustment in response to a certain event. For example, an adjustment in fan position may be performed in response to user input indicating that the sound level is undesirable. In a separate example, the position of each fan may be automatically adjusted based on sound pressure sensed while the fan is operating at a most-utilized fan speed for the fan. If a fan is used at a given speed a majority of the time, the number of position adjustments may be reduced by adjusting the fan position only when the fan is operating at that given speed. Accordingly, the benefits of destructive interference will be enjoyed a majority of the time with minimal adjustments.

Embodiments of the method include adjusting the position of one or more fans. As used herein, the "position" of a fan refers to the effective distance from the fan to a specified location outside the computer, such as a location of a user. While a lateral or vertical position of a fan within an enclosure may be adjusted, the resulting change in distance from the fan to the specified location would be marginal. A preferred adjustment in the position of a fan includes an axial movement of the fan (i.e., forward and backward relative to the axis of the fan). While embodiments may include the use of an extendable duct, the fan position may be adjusted without using any duct.

Further embodiments of the method may include receiving user input identifying a user perception regarding the sound or noise of the fans. For example, the user input may indicate whether the user perceives that the fans are too noisy, that the noise has been reduced by a position or speed adjustment, or that a current noise frequency is undesirable. Optionally, a user interface may prompt the user for user input in response to adjusting the position of one or more fans, adjusting the speed of one or more fans, or adjusting both the position and speed of one or more fans. Furthermore, the position and/or speed of the one or more fans may be adjusted in response to user input. While the user input may be binary (i.e., too loud/fine, improved/not improved, etc.) the user input may be a subjective quantity (i.e., how loud the noise is on a scale of one to ten). Since a user may be sensitive to particular frequencies of sound, input from that user may be used to identifying when a sound is perceived to be louder or more irritating. With the user input, the method may adjust the fans of the relevant compute node to a target center frequency that will avoid the sensitive frequencies.

Embodiments may be beneficially used by a single computer or instances where a plurality of compute nodes operate within a room. Furthermore, the step of sensing sound pressure at a specified location, may include sensing sound pressure at a plurality of specified locations within the room. Optionally, the position and/or speed of one or more fans in the plurality of the compute nodes within the room may be adjusted to minimize the combined sound pressure at the plurality of specified locations.

Alternatively, rather than adjusting fan positions and/or fan speeds to minimize noise at the specified locations, the method may assign a different frequency to each of the plurality of compute nodes, and tune the at least one fan of each compute node to the assigned frequency. Some separation in the frequencies of the fans may already exist, but if any two fans are determined to be generating noise at a similar frequency then one of those two fans may have their position or speed adjusted to a frequency that is separated from the other fan or any other fan in the area. By causing the fans to operate at different frequencies spread out over a wide frequency range, the fans will collectively generate white noise.

Another embodiment provides a computer program product comprising a non-transitory computer readable storage medium having program instructions embodied therewith, wherein the program instructions are executable by a processor to cause the processor to perform a method. The method comprises sensing sound pressure at a specified location, and a controller automatically adjusting a position of one or more fans among a plurality of fans to reduce the sound pressure sensed at the specified location.

The foregoing computer program products may further include program instructions for implementing or initiating any one or more aspects of the methods described herein. Accordingly, a separate description of the methods will not be duplicated in the context of a computer program product.

FIG. 1 is a schematic top view of a person 10 working at a compute node or computer 20. In this example, the computer 20 includes a first fan 22 and a second fan 24 which force air (illustrated by the wavy arrows) across one of more components, such as a central processing unit 26 and memory modules 28. In a conventional computer, the temperature of the components 26, 28 are measured (i.e., T1 and T2) and the speed of the fans 22, 24 are adjusted in order to prevent the component temperatures from exceeding a thermal threshold.

For purposes of discussion, the person 10 is considered to hear noise from each of the fans of the computer 20 at a specified location ("X") 12. In this example, the first fan 22 and the second fan 24 are side-by-side, such that their position relative to the specified location 12 (i.e., their distance from the specification location 12) is the same.

Figure 2A:
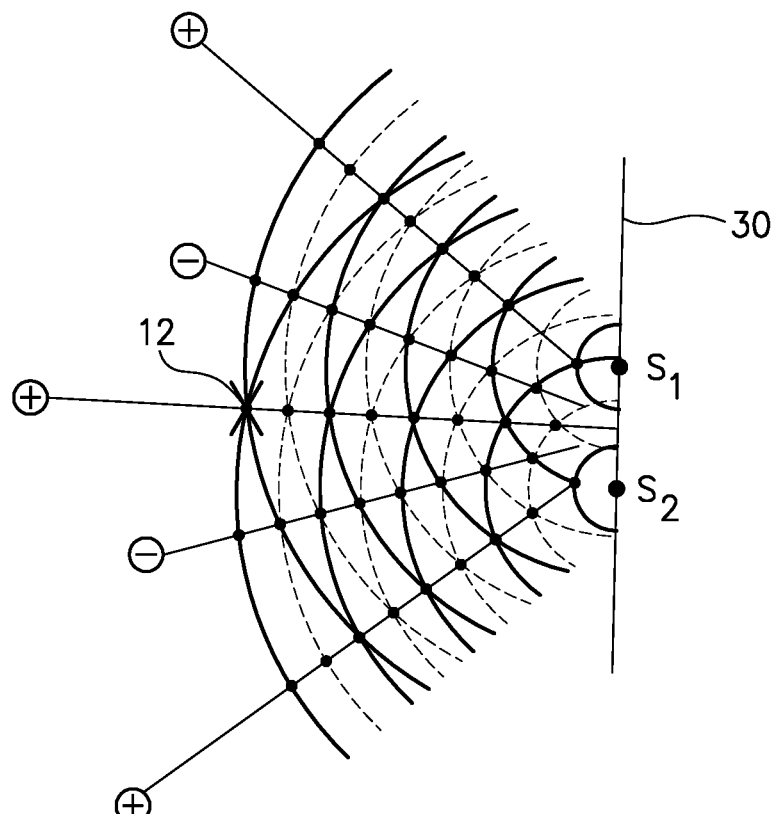
FIGS. 2A-2C are diagrams of sound waves from a first source (S1) and a second source (S2) illustrating how zones of constructive (+) interference and destructive (−) interference can be redirected.
Figure 2B:
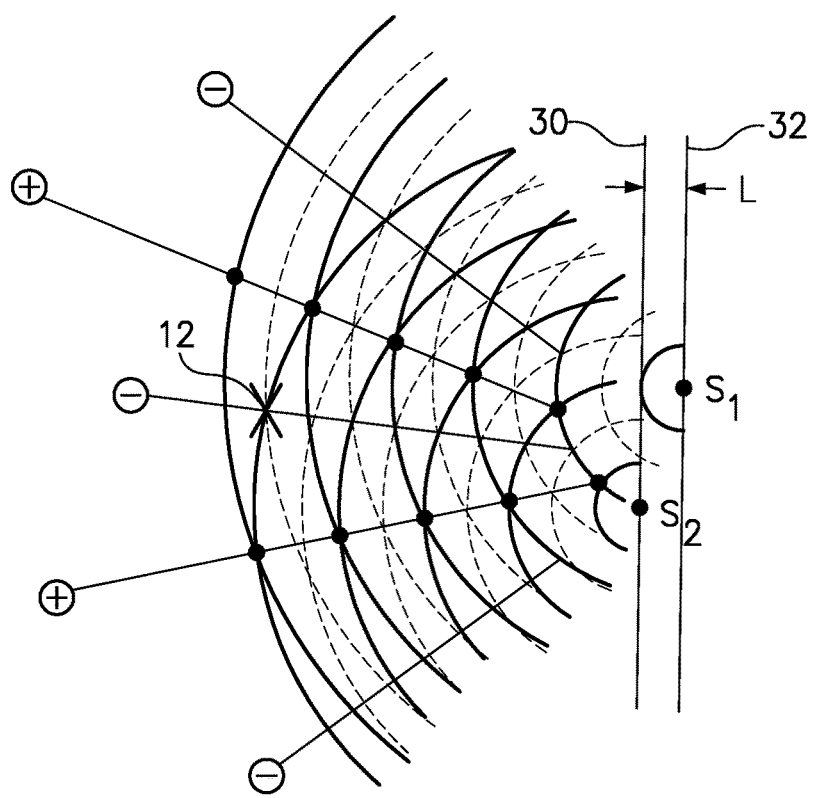
Figure 2C:
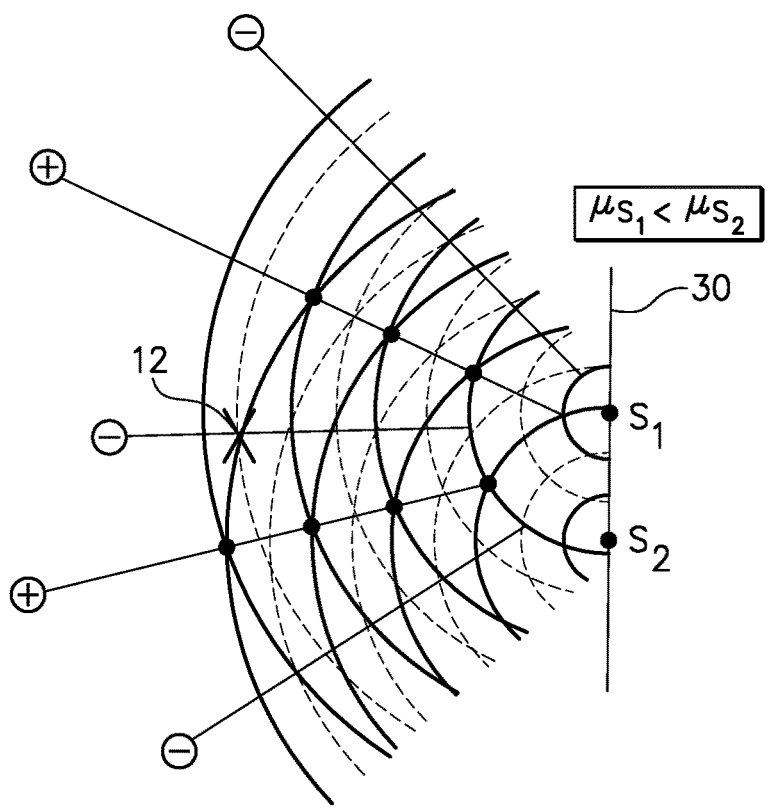

FIGS. 2A-2C are diagrams of sound waves from a first source ($S_1$) and a second source ($S_2$) illustrating how zones of constructive (+) interference and destructive (−) interference can be redirected. In FIG. 2A, the first source ($S_1$), such as the first fan 22 of FIG. 1, and the second source ($S_2$), such as the second fan 24 of FIG. 1, are positioned on a first line 30. Furthermore, the first source ($S_1$) and the second source ($S_2$) are producing sound at the same frequency and wavelength. In this illustration, successive high pressure waves from a source are drawn as solid lines and the low pressure waves between the high pressure waves are drawn as dashed lines. Points where a high pressure wave from the first source coincide with a high pressure wave from the second source will experience constructive interference, such that the sound pressure waves are stronger and the noise is louder. Conversely, points where a low pressure wave from one source coincide with a high pressure wave from the other source will experience destructive interference, such that the sound pressure waves are weaker and the noise is more quiet. As the sound propagates from the first and second sources, the points of constructive interference form lines (labeled "(+)") and the points of destructive interference form lines (labeled "(−)").

Unfortunately, if the user is sitting at the specified location ("X") 12, then the user will experience noise from the sources ($S_1$ and $S_2$) at its very loudest since the high pressure waves (and low pressure waves) will coincide and cause constructive interference. According to various embodiments, the position of one fan may be adjusted (see FIG. 2B) or the speed of one fan may be adjusted (see FIG. 2C), so that the user at the specified location ("X") 12 will experience less noise due to destructive interference. The objective is to get the sound from the two fans (source of sound) as close to 180 degrees out of phase as possible. While reaching complete cancellation is ideal, it is not realistic, but attaining a 3 to 6 decibel (dB) reduction in noise would be a noticeable change to end users (approx. −10 dB would be half as loud).

In FIG. 2B, the position of the first source ($S_1$) has been adjusted back (to the right in FIG. 2B) a distance "L", such that the distance between the first source ($S_1$) and the specified location 12 has increased by about one-half (½) of a wavelength. Accordingly, when the pressure waves reach the specified location 12, the user will now experience less noise due to the destructive interference between a high pressure wave and a low pressure wave. As shown, the line of destructive interference (labeled "(−)") has shifted upward over the specified location 12. Assuming a 500 hertz (hz) sound, a half wavelength would be about 0.331 meters (about 13 inches), whereas a 1000 hz sound would have a half wavelength of about 0.165 meters (about 6.5 inches).

In FIG. 2C, the frequency ($\mu s_1$) of the first source ($S_1$) has been reduced (i.e., the wavelength has been increased) such that the specified location 12 is again on a line of destructive interference (labeled "(−)"). It should be recognized that some combination of the adjusted position per FIG. 2B and the adjusted fan speed per FIG. 2C may be used to achieve destruction interference at the specified location 12. Furthermore, the destructive interference may be achieved regardless of whether the specified location is directly between the two sources (fans) or off to one side or the other.

Figure 3A:
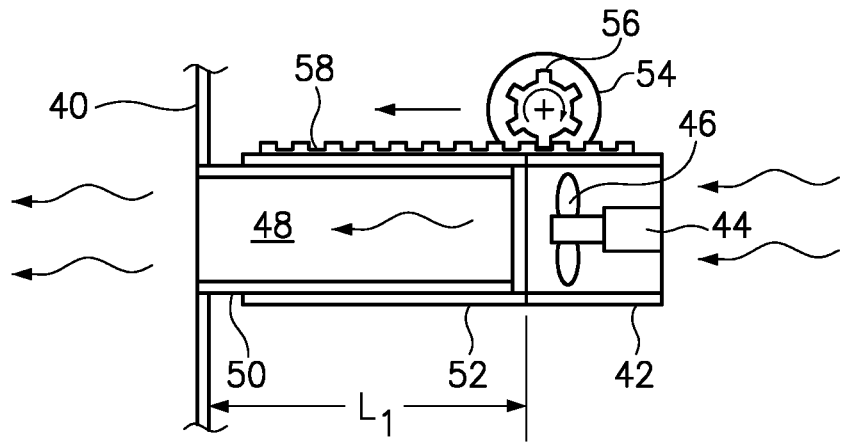
FIGS. 3A-3C are diagrams of an air duct having an adjustable length air duct suitable for repositioning a fan.

FIG. 3A is a partial schematic side view of a compute node enclosure 40 (only one face shown) according to an embodiment of the disclosure. The enclosure 40 accommodates airflow through the enclosure to cool one or more components (now shown). A fan housing 42 secures a fan motor 44 and fan blades 46 in a central opening of the fan housing 42. An inlet side of the fan housing 42 is open to draw in air and an outlet side of the fan housing 42 is coupled to an extendable air duct assembly 48. In this example, the extendable air duct assembly 48 includes a first tube 50 attached to the enclosure 40 and a second tube 52 that is nested about the first tube 50 for sliding thereon. Furthermore, a motor 54 controllably rotates a pinion gear 56 that engages a rack (linear gear) 58 secured to the second tube 52. In this configuration, activation of the motor 54 can cause an adjustment in the position of the fan housing 42. In FIG. 3, the pinion gear 56 has already rotated clockwise to retract the extendable air duct assembly 48. In other words, the second tube 52 substantially overlaps the first tube 50, such that the fan housing 42 is in it most forward (leftward) position with an outlet end of the fan housing 42 at first distance $L_1$ from the exhaust opening in the face of the enclosure 40.

Figure 3B:
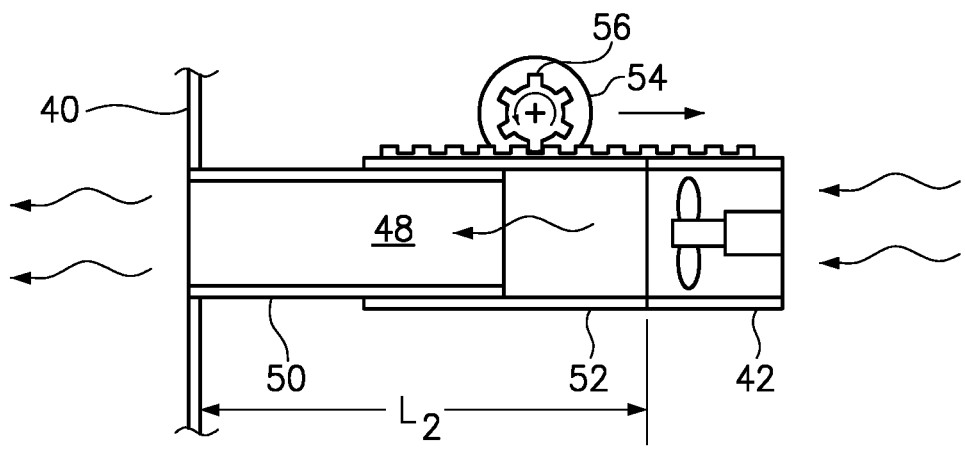

In FIG. 3B, the motor 54 has been activated to rotate the pinion gear 56 counter-clockwise and adjust the position of the second tube 52 of the extendable air duct assembly 48 backward (rightward) such that an outlet end of the fan housing 42 is a second distance $L_2$ from the exhaust opening in the face of the enclosure 40.

Figure 3C:
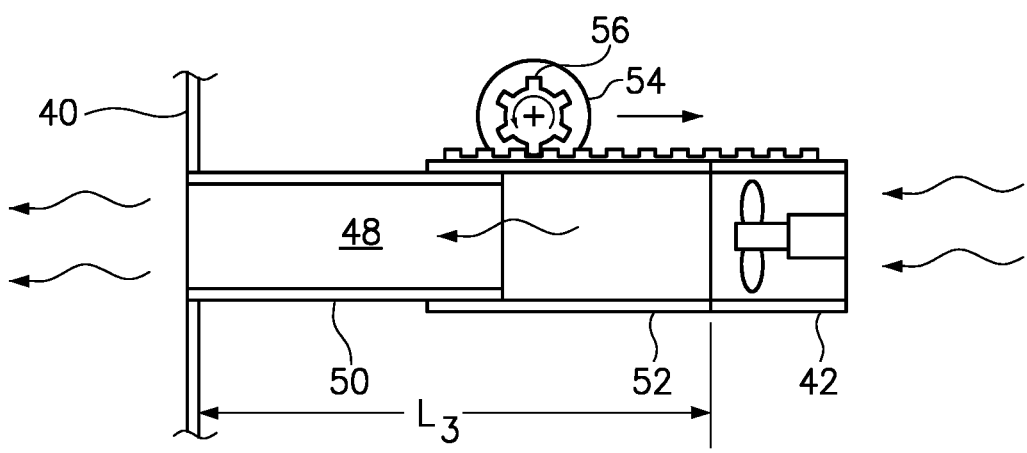

In FIG. 3C, the motor 54 has been activated to rotate the pinion gear 56 counter-clockwise an additional amount and adjust the position of the second tube 52 of the extendable air duct assembly 48 further backward (rightward) such that an outlet end of the fan housing 42 is a third distance $L_3$ from the exhaust opening in the face of the enclosure 40. It should be recognized that the apparatus shown may be used to position the fan housing 42 at any position between $L_1$ and $L_3$.

Figure 4:
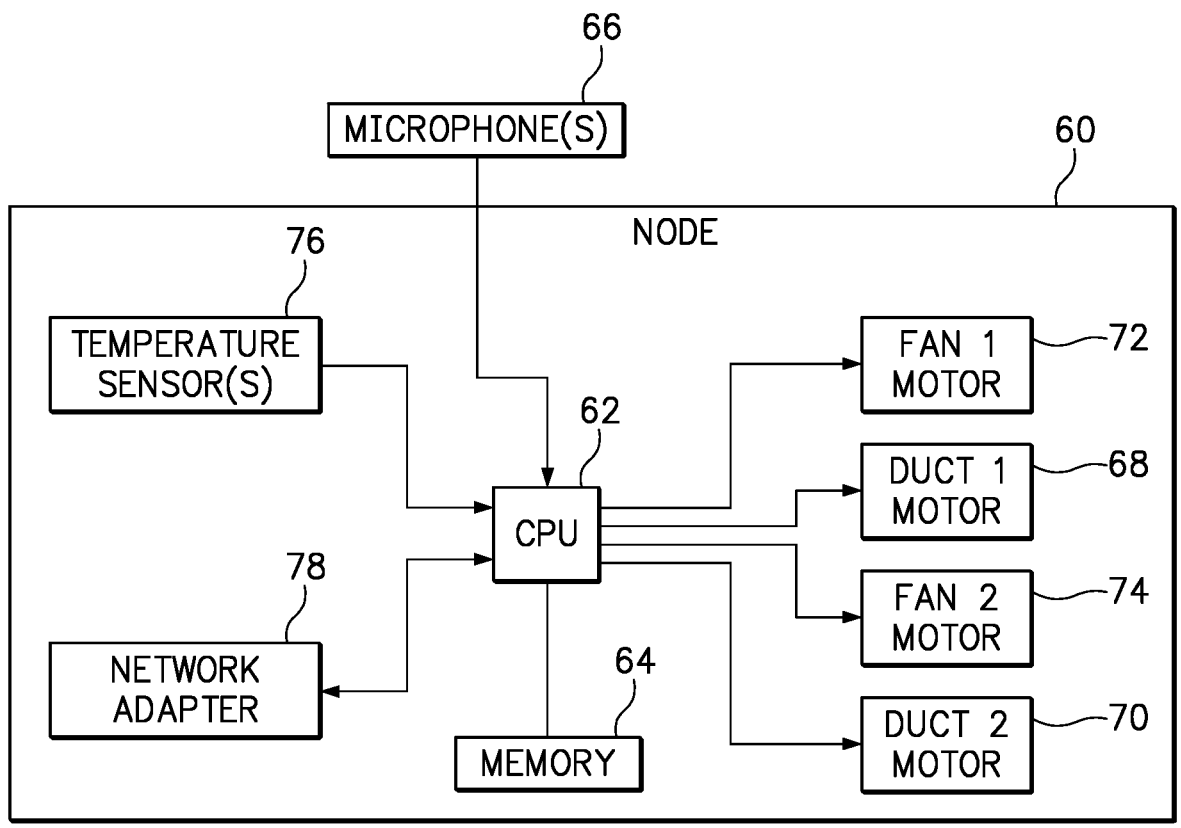
FIG. 4 is a diagram of a compute node according to one embodiment.

FIG. 4 is a diagram of a compute node 60 according to an embodiment of the disclosure. The compute node 60 includes a central processing unit (CPU) 62 that executes program instructions that may be stored in the memory 64. The program instructions may perform various aspects of the disclosed methods, such as receiving input from a microphone 66 indicating sound pressure levels at a specified location, adjusting the position of a first fan via a first air duct motor 68, adjusting the position of a second fan via a second air duct motor 70, adjusting the speed of the first fan motor 72, and adjusting the speed of the second fan motor 74. It should be recognized that the CPU may further receive a signal from a component or air temperature sensor(s) 76 and adjust the speed of the first fan motor 72 and/or the second fan motor 74 for the purpose of preventing the temperature of the component or air from exceeding a temperature threshold.

The compute node 60 may further include a network adapter 78 for communicating with other compute nodes or a management node. In this manner, the program instructions may, for example, receive additional input signals, share operating data and/or receiving operating instructions.

Figure 5:
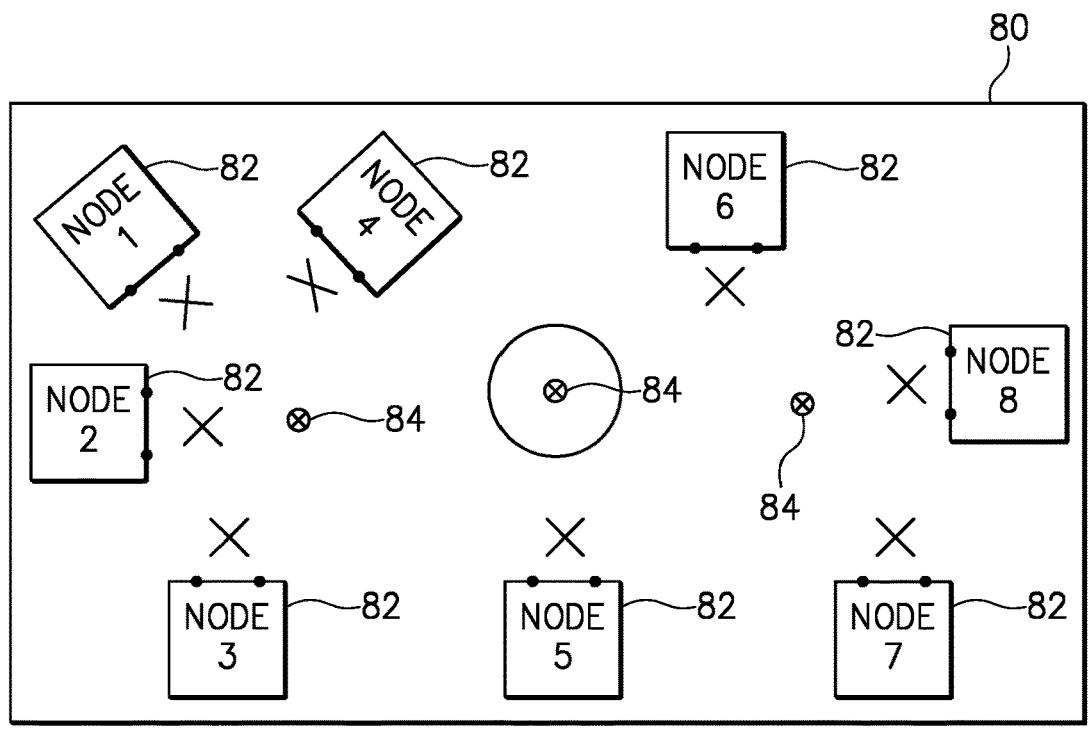
FIG. 5 is an example of a room with a plurality of compute nodes.

FIG. 5 is an example of a room 80 with a plurality of compute nodes 82. Optionally, each individual compute node may be independently controlled to reduce noise for a user working at location "X" in front of the node. However in the present illustration, the room 80 has three microphones 84 disposed down the middle of the room. The measurement of sound at these multiple locations may be used as input to adjust the fans of each computer node 82 to create an optimal room acoustic. In the case where an optimal low noise situation cannot be reached, it may be preferred to individually tune the systems to different center frequency points to create a white noise effect. This would be especially desirable in the case of a call center or cube farm.

Figure 6:
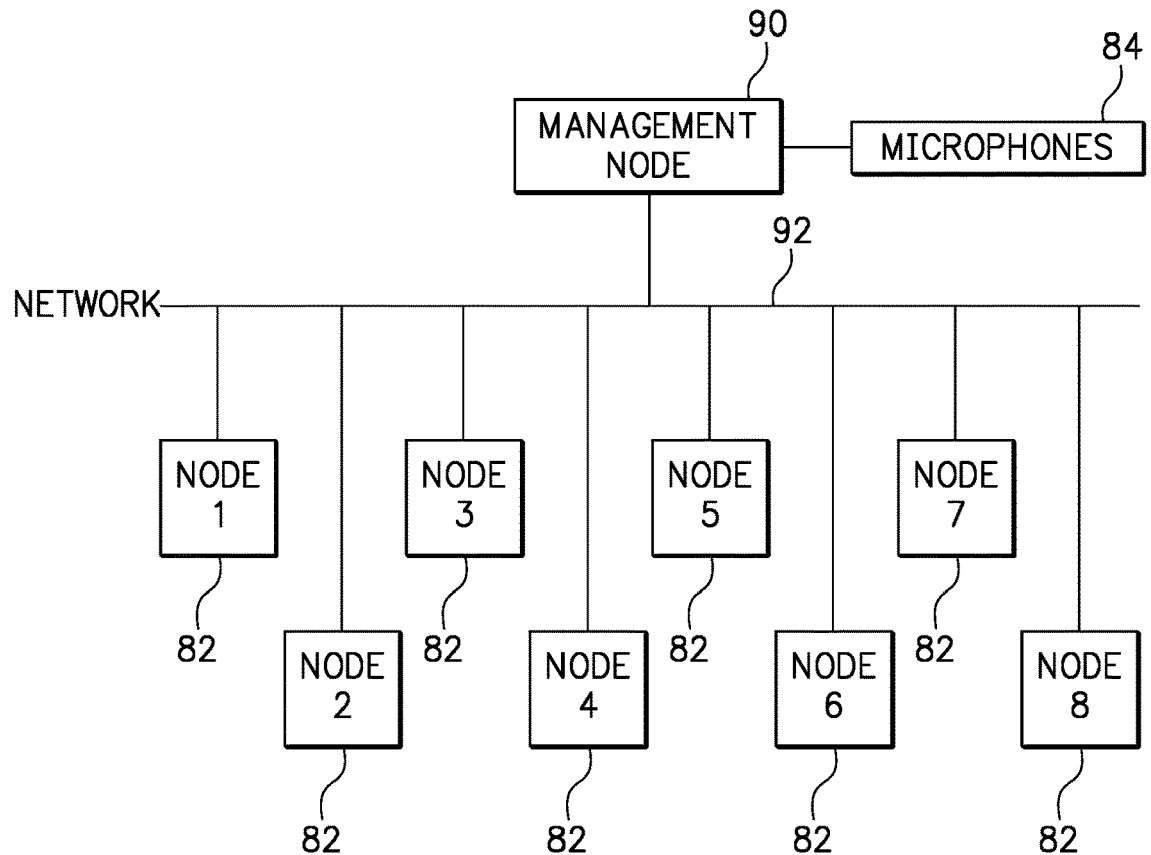
FIG. 6 is a diagram illustrating how the compute nodes of FIG. 5 may communicate with a management node over a network.

FIG. 6 is a diagram illustrating how the compute nodes 82 of FIG. 5 may communicate with a management node 90 over a network 92. With input from the microphones 84 (see also FIG. 5), the management node 90 may provide operating instructions to each of the compute nodes 82 in order to reduce the noise in the room. For example, the management node 90 may provide fan control instructions to each compute node in order to minimize the average noise at each of the three specified locations of the microphones 84. In an alternative example, the management node 90 may receive input from each compute node 82 regarding current fan operating conditions, such as each fan position and speed, and provide one or more of the compute nodes 82 with a fan operating instruction, such as fan positions and speeds. Optionally, each fan operating instruction will include a fan position and speed that will shift noise from the fans of the compute node to a designated central frequency that is set apart from the central frequency of noise of the other compute nodes. In this manner, the management node 90 may prevent multiple nodes from producing noise at the same frequency, such that the different frequencies of noise form "white noise".

Figure 7:
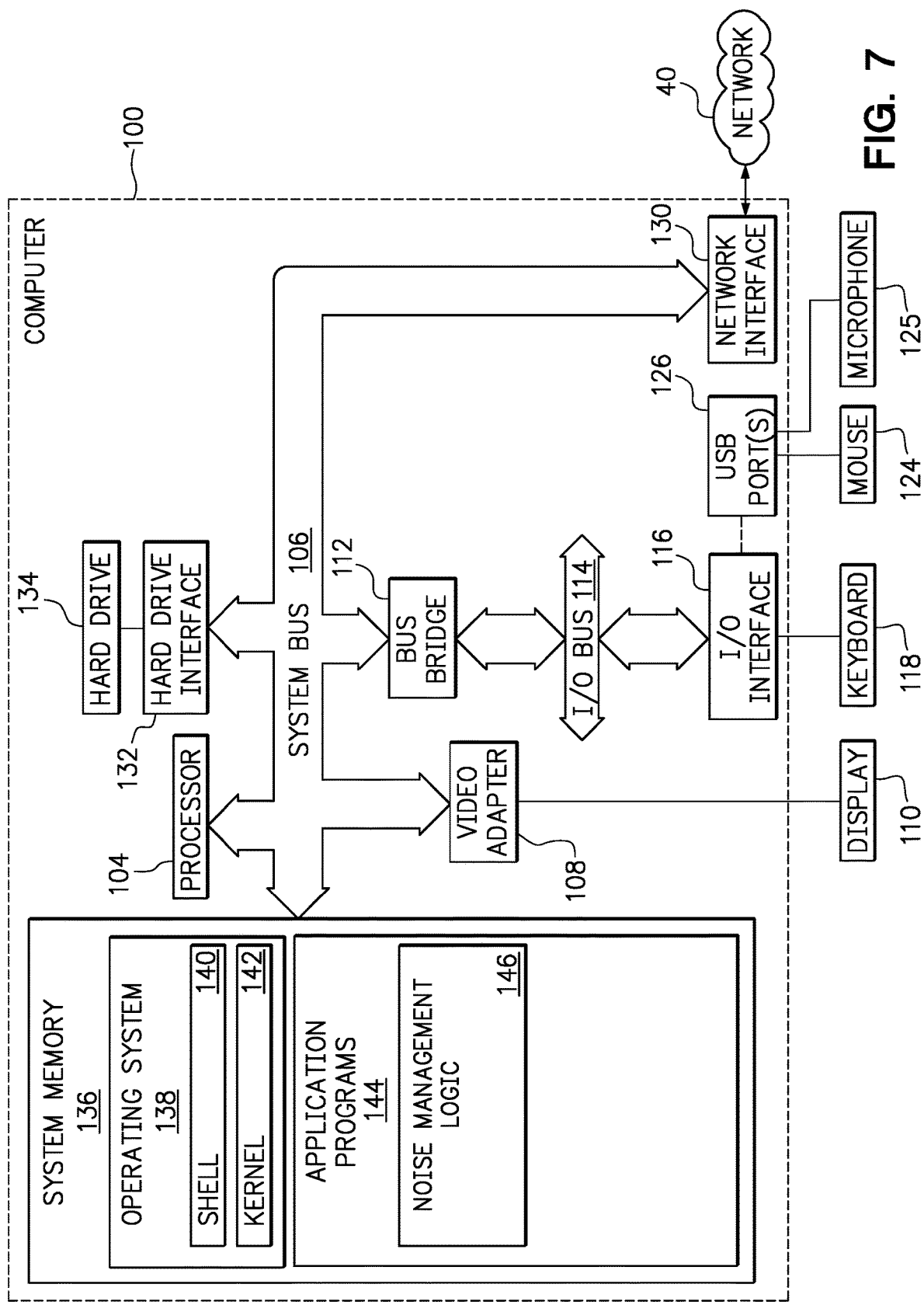
FIG. 7 is a diagram of a computer that may be representative of the management node of FIG. 6.

FIG. 7 is a diagram of a computer 100 that may implement the management node of FIG. 6 and/or the compute nodes 60, 82 of FIGS. 4-6, according to one embodiment. The computer 100 includes a processor unit 104 that is coupled to a system bus 106. The processor unit 104 may utilize one or more processors, each of which has one or more processor cores. A video adapter 108, which drives/supports a display 110, is also coupled to system bus 106. The system bus 106 is coupled via a bus bridge 112 to an input/output (I/O) bus 114. An I/O interface 116 is coupled to the I/O bus 114. The I/O interface 116 affords communication with various I/O devices, including a keyboard 118, and a USB mouse 124 via USB port(s) 126. As depicted, the computer 100 is able to communicate with other network devices over the network 40 using a network adapter or network interface controller 130. Various embodiments may further include a microphone 125 providing a noise level signal that may be used for the purpose of fan noise management.

A hard drive interface 132 is also coupled to the system bus 106. The hard drive interface 132 interfaces with a hard drive 134. In a preferred embodiment, the hard drive 134 communicates with system memory 136, which is also coupled to the system bus 106. System memory is defined as a lowest level of volatile memory in the computer 100. This volatile memory includes additional higher levels of volatile memory (not shown), including, but not limited to, cache memory, registers and buffers. Data that populates the system memory 136 includes the operating system (OS) 138 and application programs 144.

The operating system 138 includes a shell 140 for providing transparent user access to resources such as application programs 144. Generally, the shell 140 is a program that provides an interpreter and an interface between the user and the operating system. More specifically, the shell 140 executes commands that are entered into a command line user interface or from a file. Thus, the shell 140, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while the shell 140 may be a text-based, line-oriented user interface, other user interface modes, such as graphical, voice, gestural, etc may be supported.

As depicted, the operating system 138 also includes the kernel 142, which includes lower levels of functionality for the operating system 138, including providing essential services required by other parts of the operating system 138 and application programs 144. Such essential services may include memory management, process and task management, disk management, and mouse and keyboard management.

As shown, the computer 100 includes application programs 144 in the system memory of the computer 100, including, without limitation, noise management logic 146. The noise management logic 146 may use noise level signals from the microphone 125 or other input received via the network interface 130 to provide fan position and speed control signals to fans within the computer 100 or to a plurality of compute nodes in the network.

The hardware elements depicted in the computer 100 are not intended to be exhaustive, but rather are representative. For instance, the computer 100 may include alternate memory storage devices such as magnetic cassettes, digital versatile disks (DVDs), Bernoulli cartridges, and the like. These and other variations are intended to be within the scope of the present embodiments.

Figure 8:
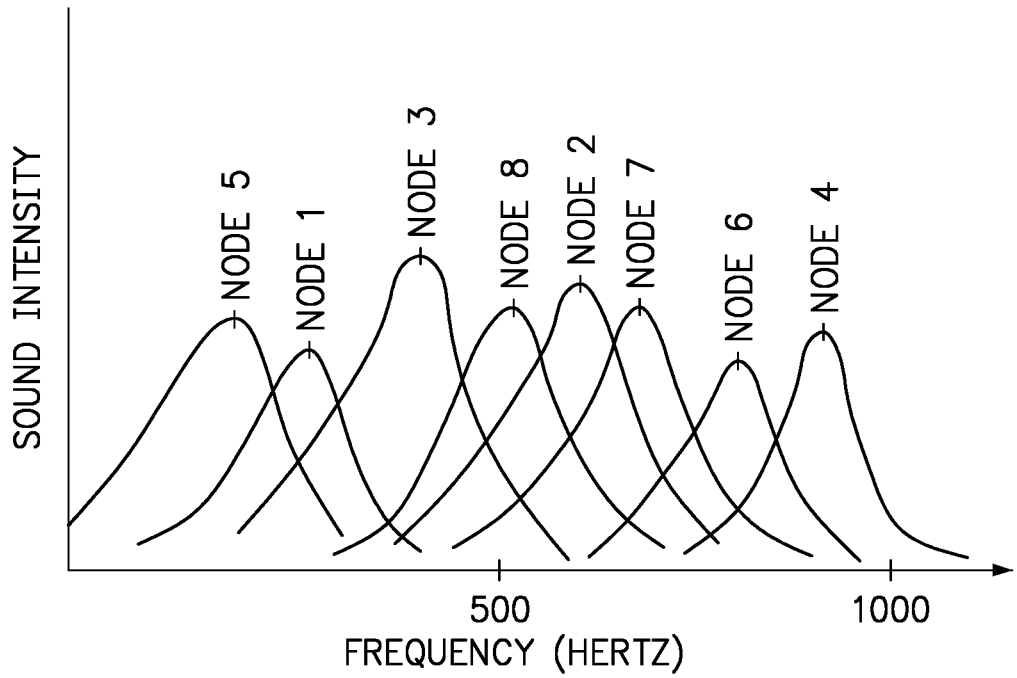
FIG. 8 is a graph illustrating the generation of white noise by offsetting the central frequency of sound generated by each of a plurality of compute nodes.

FIG. 8 is a graph illustrating the generation of white noise by offsetting the central frequency of sound generated by each of a plurality of compute nodes 82 of FIGS. 5-6. The separation between the central frequencies will produce the effect of white noise.

Figure 9:
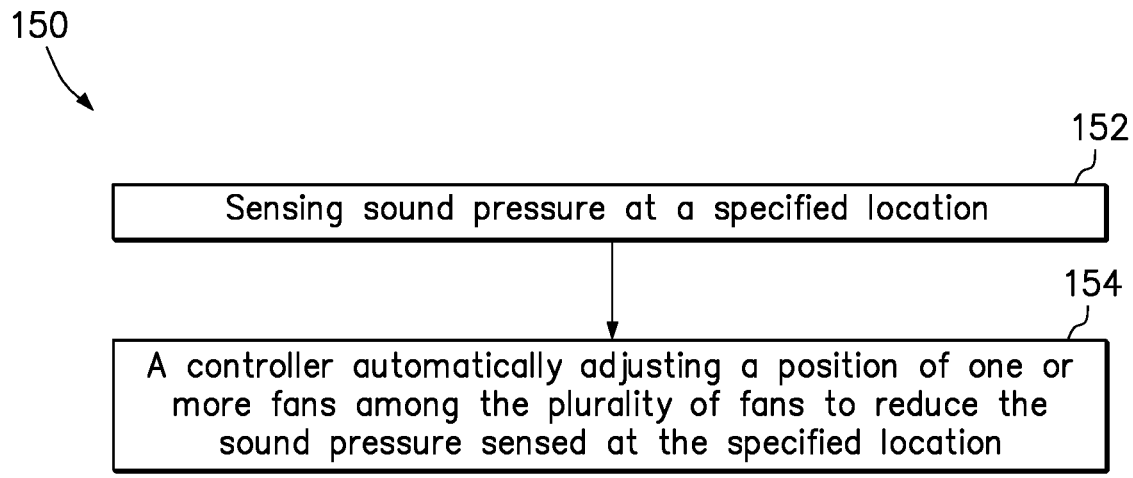
FIG. 9 is a flowchart of a method according to an embodiment.

FIG. 9 is a flowchart of a method 150 according to one embodiment. In step 152, the method includes sensing sound pressure at a specified location. In step 154, the method includes a controller automatically adjusting a position of one or more fans among a plurality of fans to reduce the sound pressure sensed at the specified location.

As will be appreciated by one skilled in the art, embodiments may take the form of a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. Furthermore, any program instruction or code that is embodied on such computer readable storage media (including forms referred to as volatile memory) that is not a transitory signal are, for the avoidance of doubt, considered "non-transitory".

Program code embodied on a computer readable storage medium may be transmitted using any appropriate medium, including but not limited to wireless, wireline, optical fiber cable, RF, etc., or any suitable combination of the foregoing. Computer program code for carrying out various operations may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments may be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored on computer readable storage media is not a transitory signal, such that the program instructions can direct a computer, other programmable data processing apparatus, or other devices to function in a particular manner, and such that the program instructions stored in the computer readable storage medium produce an article of manufacture.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to limit the scope of the claims. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the embodiment.

The corresponding structures, materials, acts, and equivalents of all means or steps plus function elements in the claims below are intended to include any structure, material, or act for performing the function in combination with other claimed elements as specifically claimed. Embodiments have been presented for purposes of illustration and description, but it is not intended to be exhaustive or limited to the embodiments in the form disclosed. Many modifications and variations will be apparent to those of ordinary skill in the art after reading this disclosure. The disclosed embodiments were chosen and described as non-limiting examples to enable others of ordinary skill in the art to understand these embodiments and other embodiments involving modifications suited to a particular implementation.

What is claimed is:

1. An apparatus, comprising:
    a computer enclosure including a first fan, a second fan, a fan controller, and an input for receiving a signal from a microphone indicating an amount of noise at a target location; and
    a first actuator coupled to the first fan for adjusting an axial position of the first fan, wherein the controller controls the operation of the first actuator to position the first fan to reduce the noise indicated by the signal from the microphone with the first and second fans in operation.

2. The apparatus of claim 1, wherein the first actuator includes an electric motor controlling a rotary gear that engages linear gear teeth secured to the fan.

3. The apparatus of claim 1, further comprising:
    an extendable duct including a plurality of nested tubes, wherein the fan is coupled to the extendable duct and movement of the fan causes the extendable duct to extend or retract.

4. The apparatus of claim 1, wherein the microphone is a headset microphone.

5. The apparatus of claim 1, wherein the first and second fans are positioned side-by-side within the computer enclosure.

6. The apparatus of claim 1, wherein the fan controller further controls the speed of at least one of the first fan and the second fan.

7. The apparatus of claim 1, further comprising:
    a second actuator coupled to the second fan for adjusting an axial position of the second fan, wherein the controller controls the operation of the second actuator to position the second fan to reduce the noise indicated by the signal from the microphone with the first and second fans in operation.

8. The apparatus of claim 7, wherein the controller controls the position and speed of the first and second fans to provide destructive interference of sound waves at a position of the microphone.

9. The apparatus of claim 1, wherein the controller is a central processing unit.

10. The apparatus of claim 9, further comprising:
a non-transitory computer readable storage medium having program instructions embodied therewith, wherein the program instructions are executable by the central processing unit to:
  prompt a user for input in response to adjusting the position of one or more of the first and second fans, adjusting the speed of one or more of the first and second fans, or adjusting both the position and speed of one or more of the first and second fans;
  receive user input identifying a user perception whether the sound pressure has been reduced; and
  further adjust the position or speed of one or more of the first and second fans in response to user input.

* * * * *